United States Patent [19]

Link et al.

[11] Patent Number: 4,998,888
[45] Date of Patent: Mar. 12, 1991

[54] INTEGRATED CIRCUIT PACKAGE WITH BATTERY HOUSING

[75] Inventors: Joseph Link, Carrollton; Michael L. Bolan, Dallas; Allen H. Brunk, Jr., Carrollton; Paul E. Schneikart, Lewisville, all of Tex.

[73] Assignee: SGS-Thomson Microelectronics, Inc., Carrollton, Tex.

[21] Appl. No.: 846,510

[22] Filed: Mar. 28, 1986

Related U.S. Application Data

[63] Continuation of Ser. No. 633,374, Jul. 23, 1984, abandoned, which is a continuation of Ser. No. 282,183, May 27, 1981, abandoned.

[51] Int. Cl.$^5$ .................................................. H01R 13/00
[52] U.S. Cl. ............................................................ 439/73
[58] Field of Search .............. 339/17 D, 17 CF, 75 R, 339/75 M, 75 MP, 152; 174/52 FP; 361/395, 401; 46/228, 229, 230, 231; 429/98, 100; 29/827, 843, 854, 855, 856, 881; 307/66; 364/187; 365/229

[56] References Cited

U.S. PATENT DOCUMENTS

| | | |
|---|---|---|
| 2,782,389 | 2/1957 | Sunko et al. .......................... 339/192 |
| 3,289,045 | 11/1966 | Pritkin et al. .................... 174/52 FP |
| 3,575,678 | 4/1971 | Barton .............................. 174/52 FP |
| 3,634,600 | 1/1972 | Griffin et al. ....................... 174/52 S |
| 3,816,768 | 6/1974 | Stein . |
| 3,823,388 | 7/1974 | Chadima, Jr. et al. . |
| 3,859,638 | 1/1975 | Hume, Jr. ............................. 365/229 |
| 4,019,174 | 4/1977 | Vanderpool et al. . |
| 4,051,945 | 10/1977 | Fujimoto et al. . |
| 4,107,400 | 8/1978 | Grohoski . |
| 4,122,359 | 10/1978 | Breikss . |
| 4,142,287 | 3/1979 | Grabbe ................................. 29/827 |
| 4,143,283 | 3/1979 | Graf et al. ............................. 307/66 |
| 4,143,417 | 3/1979 | Wald et al. . |
| 4,223,395 | 9/1980 | Skaguchi et al. . |
| 4,232,377 | 11/1980 | Tallman . |
| 4,245,877 | 1/1981 | Auriana ............................. 339/74 R |
| 4,247,603 | 1/1981 | Leffingwell et al. . |
| 4,251,604 | 2/1981 | Umemoto ............................. 429/98 |
| 4,288,865 | 9/1981 | Graham . |
| 4,326,765 | 4/1982 | Brancaleone . |
| 4,351,580 | 9/1982 | Kirkman et al. ............... 339/17 CF |
| 4,383,184 | 5/1983 | McFarland . |
| 4,430,724 | 2/1984 | Hamilton et al. . |
| 4,443,845 | 4/1984 | Hamilton et al. . |
| 4,451,742 | 5/1984 | Aswell ............................... 365/229 |
| 4,457,021 | 6/1984 | Belisomi . |
| 4,503,494 | 3/1985 | Hamilton et al. . |
| 4,516,218 | 5/1985 | Hamilton et al. . |

FOREIGN PATENT DOCUMENTS

| | | |
|---|---|---|
| 2752385 | 8/1978 | Fed. Rep. of Germany . |
| 566281 | 2/1972 | Japan . |
| 1313718 | 4/1973 | United Kingdom . |
| 1507036 | 4/1978 | United Kingdom . |
| 1520573 | 8/1978 | United Kingdom . |
| 1549191 | 7/1979 | United Kingdom . |
| 1549307 | 7/1979 | United Kingdom . |
| 1554013 | 10/1979 | United Kingdom . |

OTHER PUBLICATIONS

IBM Technical Disclosure Bulletin, vol. 15, No. 11, Apr. 1973, pp. 3408-3409.
IBM Technical Disclosure Bulletin, vol. 15, No. 9, Feb. 1973, p. 2830.
IBM Technical Disclosure Bulletin, vol. 14, No. 9, Feb. 1972; pp. 2712-2713.
Effluent Monitoring for Nuclear Safeguards, by Luciano Stanchi, 1976, Nuclear Science Symposium.

*Primary Examiner*—Joseph H. McGlynn
*Attorney, Agent, or Firm*—Dale B. Nixon; Richard K. Robinson

[57] ABSTRACT

An integrated circuit, typically a random access memory, is housed in a package (14). In the application associated with the integrated circuit it is desired to maintain the data states stored in the memory even when the normal supply voltage is disconnected from the package (14). Batteries (24, 26) are secured in recesses (20, 22) within a structure (12) which is connected to the integrated circuit package (14). A top spring clip (100) is provided to securely hold the batteries (24, 26) within the recesses (20, 22) and forms a common conductor in contact with the upper terminal of both batteries. A bottom spring clip (74, 76) is provided for each of the recesses (20, 22) to form separate conductors in contact with the lower terminal of each battery. The batteries can be readily inserted and removed over lips (64, 70) in the recess (20, 22).

20 Claims, 3 Drawing Sheets

INTEGRATED CIRCUIT PACKAGE WITH BATTERY HOUSING

CROSS REFERENCE

This is a continuation of application Ser. No. 633,374 filed on July 23, 1984, now abandoned, which in turn was a continuation of application Ser. No. 282,183, filed on May 27, 1981, now abandoned.

TECHNICAL FIELD

The present invention pertains to integrated circuits and the packages therefore and more particularly to a package for housing a battery to sustain data states in volatile semiconductor memories.

BACKGROUND OF THE INVENTION

There are many applications involving integrated circuits and in particular integrated circuit memories in which it is desirable to maintain power to the circuit at all times to sustain data states which are stored in the circuit. When power is removed from the circuit critical parameters are often lost due to the volatile memory. In many applications it is necessary to reload these parameters before operations can be continued.

It would thus be advantageous to have an integrated circuit package, particularly for a semiconductor memory, which has structure for inclusion of a battery or batteries so that the data states can be maintained in the memory even if the normal source of power is terminated.

SUMMARY OF THE INVENTION

In its most general form the present invention comprises apparatus for use in conjunction with an integrated circuit. The apparatus includes a package which houses the integrated circuit. A structure is provided for securing at least one battery to the integrated circuit package. Electrical conductors are positioned to extend from the structure securing the batteries to the integrated circuit within the package.

In a more detailed embodiment of the present invention the structure for securing the batteries includes one or more recesses in a surface thereof with each recess adapted for receiving a battery. A member is provided for connection to the structure to extend above the recesses for holding a battery in each of the recesses. A common battery contact is provided on this member for connection to a common terminal of each of the batteries. The common contact extends from the batteries through the lead frame to the integrated circuit. A separated power contact is provided for each of the recesses for connecting the battery therein to the integrated circuit. Therefore, with a plurality of batteries housed in conjunction with the integrated circuit the reliability of the data storage in the circuit is enhanced and the time period for storage of the data is extended. The batteries may be connected in parallel or in series.

The present invention also comprises a method of constructing an apparatus for use in conjunction with an integrated circuit. The method includes the steps of mounting an integrated circuit in a package, securing a battery to the package and electrically interconnecting the integrated circuit and the battery.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE PREFERRED EMBODIMENT

Figure 1:
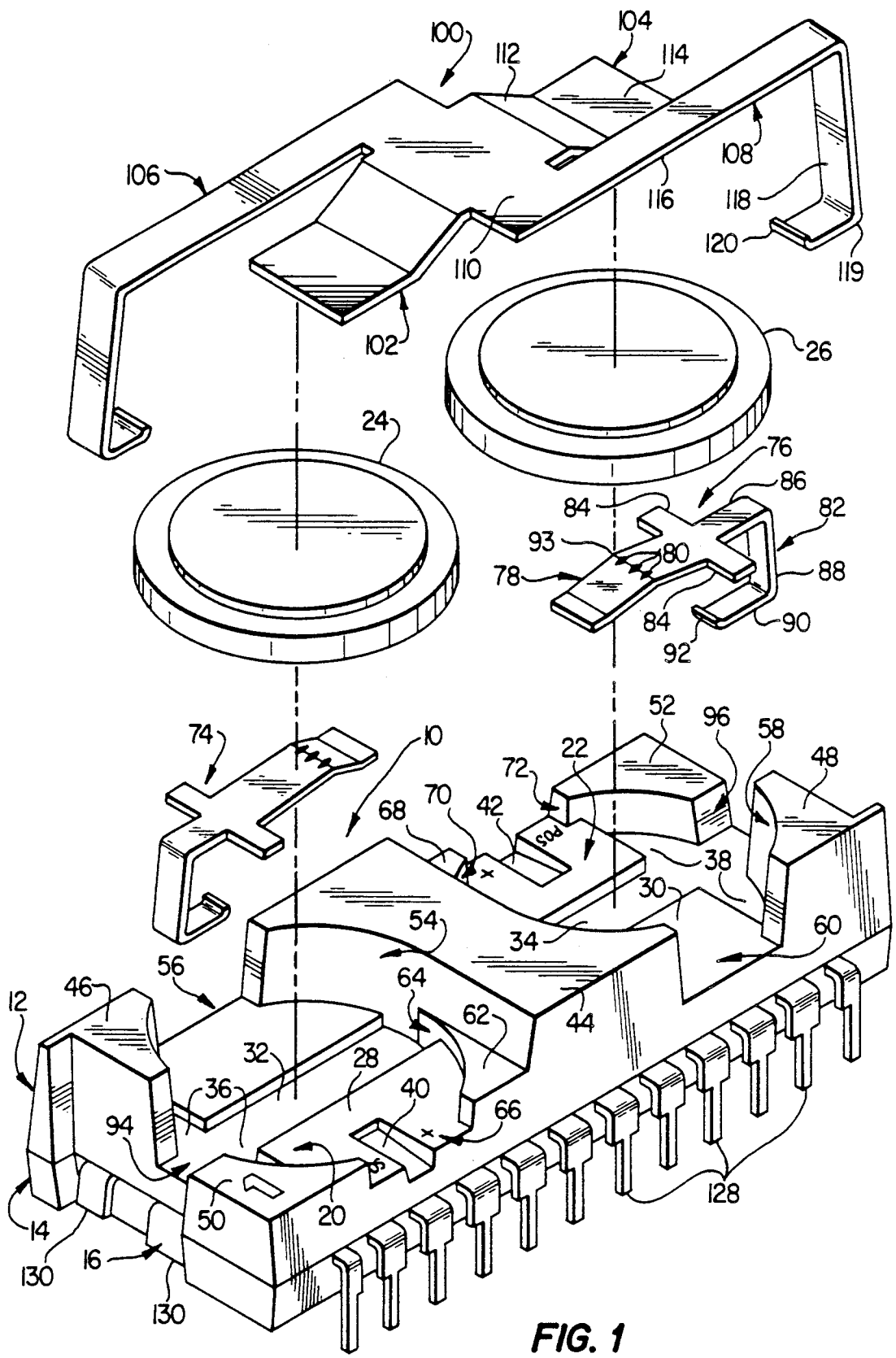
FIG. 1 is an exploded view of a structure for housing a plurality of batteries which are connected to an integrated circuit within an adjacent package and the batteries.

A first embodiment of the present invention is illustrated generally by the reference numeral 10 in FIG. 1. The apparatus 10 includes a rectangular structure 12 which is generally disposed above a dual in-line integrated circuit package 14. The package 14 includes an integrated circuit which communicates with external components through lead frame 16 having leads forming pins and tabs. The lead frame 16 described hereinafter and illustrated in the figures has 24 pins and 3 tabs provided for communication with the integrated circuit. However, the number of leads may vary with the application in which the integrated circuit is to be used.

Recesses 20 and 22 are formed in the upper surface of the structure 12. These recesses are shaped to receive batteries 24 and 26.

Figure 2:
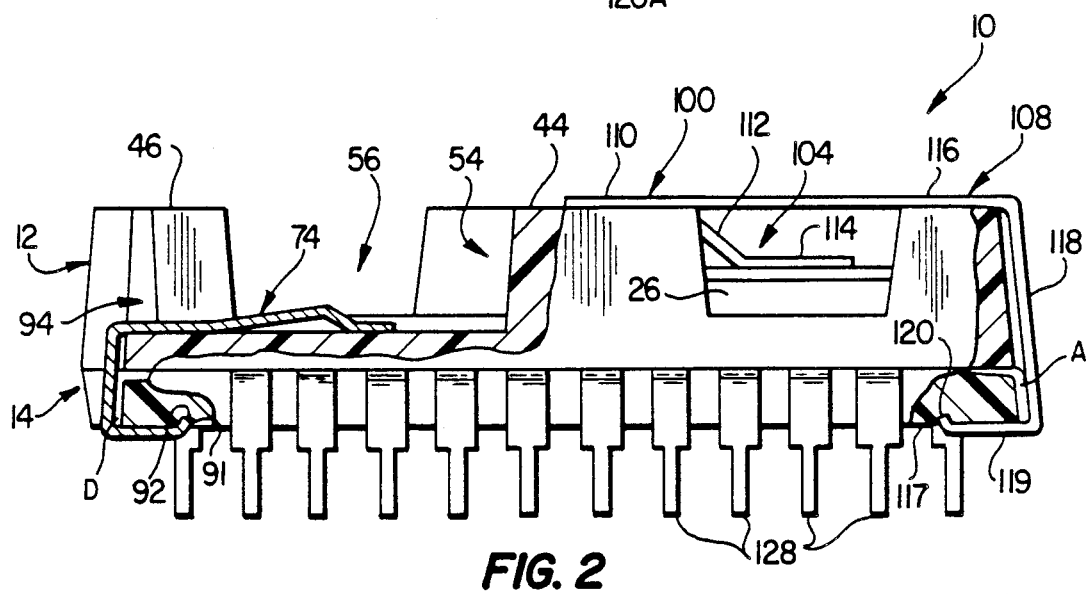
FIG. 2 is a partial cross-section elevation view of the integrated circuit package and the structure for receiving batteries.
Figure 3:
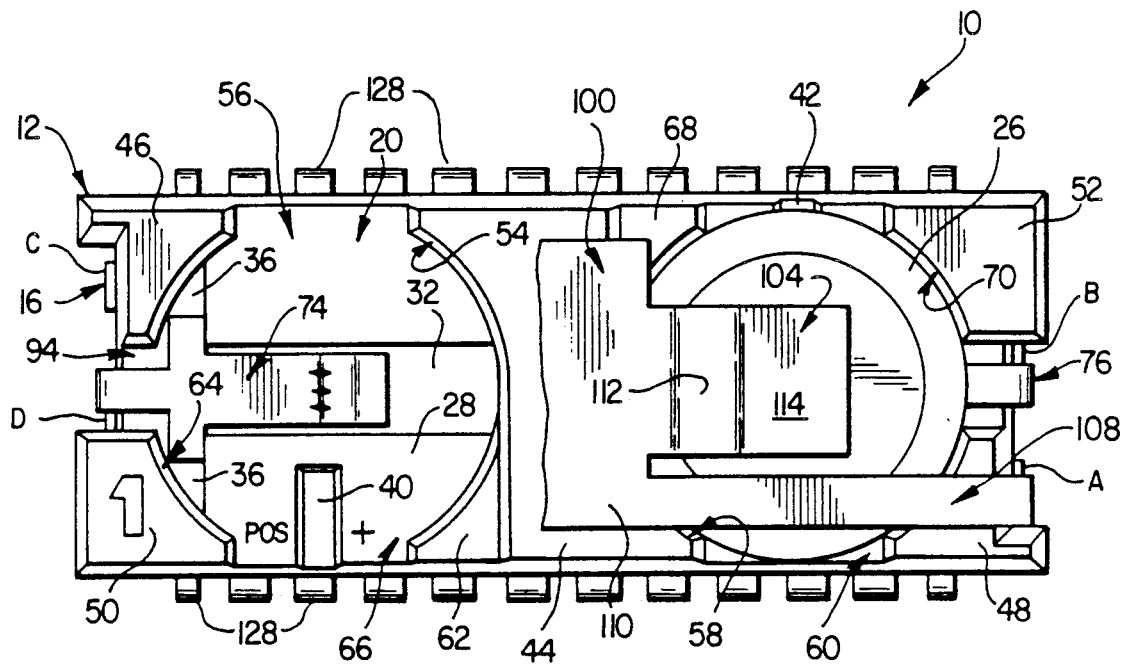
FIG. 3 is a partial cross-section plan view of the structure illustrated in FIG. 2 with the batteries and upper clip removed therefrom to better illustrate the underlying structure.

Each recess 20 and 22 includes a bottom portion 28 and 30, respectively. The underside of each battery 24 and 26 rests on the bottom portion 28 and 30 as best shown in FIG. 2. Each bottom portion includes an elongate notch 32 or 34 which extends below the plane of the bottom portion. The notch 32 includes arms 36 at the outer portion thereof which include an arcuate portion as best seen in FIG. 3. Notch 34 similarly includes arms 38. Inclined notches 40 and 42 are also formed in the bottom portions. The notches are inclined upwardly towards the center of the bottom portions.

A central dividing member 44 extends upward between the bottom portions. Wall end members 46 and 48 extend upwardly from opposed corners of the structure 12. Lip end members 50 and 52 extend upwardly at the opposite opposed corners of structure 12.

Central dividing member 44 and wall end member 46 define a semi-circular wall 54 surrounding the bottom portion 28. The wall portion is broken by a slot 56 formed between the members 44 and 46. A similar semi-circular wall portion 58 is defined by the members 44 and 48. The portion 48 is broken by slot 60.

The central dividing member 44 includes an extension 62 which defines a semi-circular lip 64 with the lip end member 50. The lip is broken by a slot 66 between the extension 62 and member 50. A similar extension 68 defines lip 70 between the extension and member 52. A slot 72 interrupts the lip between the extension and member.

Bottom spring clips 74 and 76 are positioned within the notches 32 and 34, respectively. Each of the clips 74 and 76 is identical. Therefore, only clip 76 will be described in detail. The clip 76 is formed of a resilient conductor material. The clip includes a battery contact portion 78 having one or more point contacts 80 thereon. The point contacts are designed to provide enhanced ohmic contact with the lower terminal of the battery, i.e., lessen contact resistence.

The clip 76 also includes a fastener portion 82. The fastener portion 82 includes tabs 84, an outwardly extending horizontal piece 86, a downwardly extending vertical piece 88, and an inwardly extending horizontal piece 90. The free end of piece 90 includes an up-turned end 92.

The clips 74 and 76 are mounted in the structure 12 as shown in FIGS. 1-3. The battery contact portion 78 of the clips extend along the notches 32 and 34 with the point contacts 80 centered within the bottom portions. The tabs 84 of clips 74 and 76 extend into the arms 36 and 38, respectively. The pieces 86 extend through slots 94 and 96 in structure 12 and the pieces 88 and 90 extend downwardly and inwardly into contact with individual leads on lead frame 16. The pieces 90 extend inwardly below the package 14 and the ends 92 are preferably received within notches 91 formed in the bottom of the package 14.

It is apparent that the configuration of the clips 74 and 76 will maintain the clips secured to the apparatus 10. The clips are designed so that the point contacts 80 extend above the plane defined by the bottom portions 28 and 30 when nondeformed. A camber 93 in the battery contact portions 78 along the line of contacts 80 insure the contacts project furthest above the bottom portions. In the preferred embodiment, the fastener portions 82 of the clips are also soldered to the lead frame to prevent removal of the clips and insure a positive electrical connection.

A top spring clip 100 is provided. The spring clip includes battery contact portions 102 and 104 and fastener portions 106 and 108. The clip 100 is preferably formed from an integral piece of a flexible, conductive material.

The battery contact portions 102 and 104 include a common center 110 and each include a downwardly inclined piece 112 and a horizontal piece 114. The fastener portions 106 and 108 include outwardly extending horizontal pieces 116, vertically downward extending pieces 118 and inwardly extending horizontal pieces 119 terminating in upwardly curved ends 120.

Figure 1A:
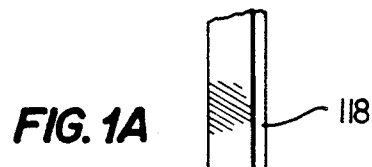
FIG. 1A is a detail of an alternate end for the spring clips used in the present invention.

The top spring clip 100 extends over the structure 12 and the pieces 118 and 119 of the fastening portions and ends 120 retain the clip secured to structure 12. Again, recesses 117 may be provided in the package 14 to accept ends 120. An alternate end 120A shown in FIG. 1A may be substituted for pieces 90 and 119 and ends 92 and 120. The end 120A includes a curved portion of constant radius. Portions of pieces 118 and 119 of each fastener portion 106 and 108 are in physical and electrical contact with leads on lead frame 16. In the preferred embodiment, the fastener portions are soldered to the frame to prevent disengagement of the clip and insure electrical contact.

In operation, the batteries 24 and 26 may be inserted within the apparatus 10 by sliding the batteries over the extensions 62 and 68 and lip end members 50 and 52 for their respective recesses. The placement of the batteries may be determined by a positive sign or language stamped on apparatus 10 as shown. The batteries are tilted to deflect the battery contact portions of the top spring clip upward and the battery contact portions of the bottom spring clips downwardly into their respective notches to permit the batteries to be seated within the recesses.

Once positioned as shown in FIGS. 2 and 3, the batteries are confined within the recesses by the lips 64 and 70, wall portions 54 and 58 and the battery contact portions of the bottom and top spring clips. The top spring clip 100 is designed to exert a downward force on the batteries through the battery contact portions 102 and 104 exceeding the upward force of the battery contact portions 78 of the bottom spring clips. The excess force is designed to retain the batteries in contact with the bottom portions during the worst shock loading for which the apparatus 10 is designed.

The force exerted by the battery contact portions 78 of the bottom spring clips is sufficient to insure adequate electrical contact between the point contacts 80 and the lower terminal of the batteries. The force exerted by the battery contact portions 102 and 104 of the top spring clip also provide electrical contact between the top spring clip and the upper terminal of the batteries. It is clear from FIGS. 1 and 3 that the upper terminals of the batteries are common and maybe connected through the top spring clip 100 to the integrated circuit and or more one pins 18. The lower terminal of each battery may be connected to individual or common leads on lead frame 16 leading to the integrated circuit.

In a typical application, an integrated circuit static memory will be included in the package 14. The integrated circuit is utilized in such a manner that it is necessary to retain the data states stored in the memory even if power if lost to the memory. The batteries 24 and 26 may be connected in parallel through circuitry (not shown) which automatically connects the integrated circuit within package 14 to either one or both of the batteries upon detection of loss of external power. Two batteries are utilized to improve reliability and to extend the length of time that the data can be stored. The interfacing circuitry between the batteries and the integrated circuit is designed to switch between the best of the two batteries and thereby provide the maximum possible data retention time. This circuitry is described in greater detail in U.S. patent application Ser. No. 282,179 filed May 27, 1981 and assigned to the assignee of the present application which is hereby incorporated by reference. The batteries may be connected in series if a high voltage source is needed for a particular application.

If one of the batteries fails, it may be removed independently of the other battery. A thin non-conductive implement may be guided into contact with the battery to be removed through its associated inclined notch 40 or 42. A non-conductive implement is preferred to eliminate the potential for shorting the other battery or damaging the integrated circuit. Urging the implement into contact with the battery tilts the portion of the battery adjacent to the lip upward to permit its removal. If difficulty is encountered, an implement may be inserted through the slot 56 or 60 adjacent to the battery to push the battery from the recess.

The present invention provides several additional significant advantages. The batteries may be inserted or replaced in the apparatus 10 without removal of the apparatus from a printed circuit board or socket. Each of the batteries may be inserted or removed independently of the other battery so that the integrated circuit may be maintained in an active state continuously. The spring clips are securely, if not permanently, secured to the apparatus 10 which prevents loss of the clips during battery insertion or removal. The top spring clip 100 is the only spring exposed to operator induced stresses. The stress on the bottom spring clips does not exceed the stress necessary to urge the clips downward to permit the insertion of the batteries. Therefore, the provision of the stronger spring in the top spring clip reduces the potential for spring overstress. One or more of the spring clips may be connected to pins leading to externals. The externals may provide a trickle charge to retain the batteries in a charged state.

A suggested battery for use in this application is a Model CR-1220 lithium battery manufactured by Sanyo Electric Trading Co., Ltd. of Osaka, Japan. This battery produces a nominal 3.0 volts, has a capacity of 30 mah, a diameter of 12.5 millimeters, a thickness of 2.0 millimeters, a weight of 0.8 grams and can function over the temperature range of $-20°$ C. to $+50°$ C.

In one apparatus constructed from the teaching of the present invention, the apparatus was adapted to receive batteries having a thickness of approximately 78 millimeters. In the constructed apparatus, lips 64 and 70 were designed to have a vertical height of 40 to 50 millimeters and the wall portions 54 and 58 a vertical height of 90 millimeters. The downward force exerted on the battery by the top spring clip 100 in the constructed apparatus was designed to be 1500 grams and the upward spring force exerted by the bottom spring clip on the batteries was designed to be 250 grams, a ratio of 6 to 1. The clips in this constructed apparatus were constructed of berylium copper. This material is designed to retain resiliency across the full semi-conductor temperature range. Phosphor bronze may also be employed as the spring clip material in lower temperature applications.

Figure 4:
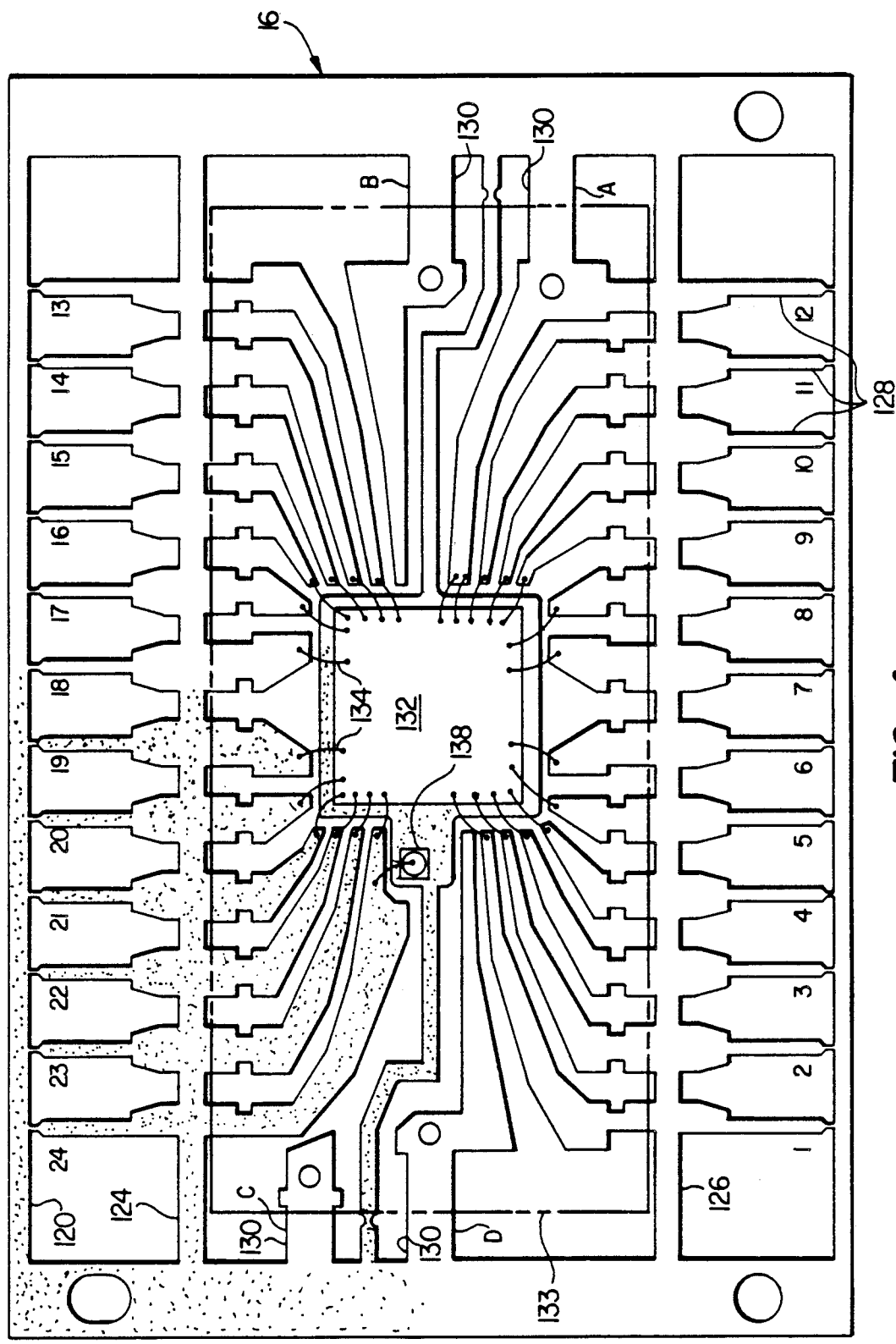
FIG. 4 is a plan view of a lead frame for use in the integrated circuit package.

The detail of lead frame 16 is illustrated in FIG. 4. The lead frame 16 is formed in several stages. The first stage comprises the stamping of the shape shown in FIG. 4 in a conductive material. The body, comprising structure 12 and package 14 may then be molded about the lead frame 16 and CMOS 132. The outside limit of the body is shown by dotted line 133. The body is commonly formed of a plastic. In subsequent steps, the rail 120 is removed and the tie bars 124 and 126 are separated between each pin 128 and tab 130 to form independent leads to the integrated circuit, in this example a CMOS 132. Portions of the pins 128 and tabs 130 extend exterior of the plastic body forming the structure and package.

Twenty four individual pins 128 are provided on the frame 16 for contact with externals. The pins are numbered by convention from 1 to 24 beginning at the lower left pin in FIG. 4 and proceding counterclockwise about the frame. Four tabs 130 are provided and are identified by letters A-D. Each pin and tab contacts terminals in CMOS 132 through small wires 134 bonded between the pins and tabs and contact pads 136 on CMOS 132.

Pin 12 and tab A form one conductor which acts as a common. One end of top spring clip 100 may be in contact with tab A. The opposite end of clip 100 may be secured to tab C, which has no electrical connection to the integrated circuit but aids in the retention of the clip 100 on the apparatus 10. If the batteries are positioned with their negative terminals in contact with top spring clip 100, the common will be the negative terminal. Two wires 134 are employed for connection to CMOS 132 as the current flow at this location may be large.

Tabs B and D are positioned for contact with bottom spring clips 74 and 76. Power for operating CMOS 132 from an external source will be connected to pin 24. A diode 138 is provided to permit external power to flow to the CMOS 132 while blocking flow to the batteries. If the external power is lost, the diode permits energy to flow from the batteries to power the CMOS 132. With diode 138, the batteries cannot be charged by an external power source. However, the design of a circuit permitting the charging of the batteries would be obvious to one skilled in the art.

While apparatus 10 forms one embodiment of the present invention, it will be understood that the shape of the apparatus is related closely to the shape and type of battery employed. For example, the Model BR435 battery manufactured and sold by Matsushita Electric Industrial Company, Ltd. of Japan has an overall tubular shape with the negative terminal formed by a pin extending from one end of the tubular portion and the positive terminal formed by an annular ring adjacent the pin. The apparatus 10 would be modified to accept the tubular shape and clips 74, 76 and 100 modified to contact the terminals and secure the batteries in place in the apparatus.

It will also be understood that the clips may extend to any portion of the apparatus desired. For example, the clips may extend on the side of apparatus 10 to contact one or more pins 128 in the lead frame 16. In addition structure 12 may be secured or mounted to package 14 in any suitable manner.

In summary the present invention comprises an apparatus to house one or more batteries in conjunction with a packaged integrated circuit. The batteries in the housing are connected such that data stored in the integrated circuit is retained for an extended period of time without external power or the operation of the integrated circuit can continue for an extended period of time without external power.

Although a single embodiment of the invention has been illustrated in the accompanying Drawings and described in the foregoing Detailed Description, it will be understood that the invention is not limited to the embodiments disclosed, but is capable of numerous rearrangements, modifications and substitutions without departing from the scope of the invention.

We claim:
1. Apparatus comprising an integrated circuit formed on an integrated circuit chip, a leadframe electrically connected to said integrated circuit, said leadframe having a plurality of connector pins, a housing of insulating material molded about and encapsulating said integrated circuit and a portion of said leadframe so that said connector pins extend externally of said housing for connection to an external source of electrical power, battery support means for receiving and supporting at least one battery within said housing, said battery support means being formed integrally with said housing and comprising at least one recess formed in said housing, each said recess adapted to receive a battery, and clip means connected to said housing extending in a spaced relationship to each said recess for securing said battery in each said recess, the battery being carried within said battery support means for supplying electric power to said integrated circuit, and electrical conductor means electrically connecting said battery to at least two of said connector pins for supplying electrical power to said integrated circuit.

2. Apparatus according to claim 1 wherein said clip means forms an electrical conductor and is in contact with a terminal on the battery upon securing the battery in the recess.

3. Apparatus comprising an integrated circuit formed on an integrated circuit chip, a leadframe electrically connected to said integrated circuit, said leadframe having a plurality of connector pins, a housing of insulating material molded about and encapsulating said integrated circuit and a portion of said leadframe so that said connector pins extend externally of said housing for connection to an external source of electrical power, at least one recess formed in a surface of said housing, each recess adapted for receiving a battery to supply electrical power to said integrated circuit upon cessation of power from said external source of electrical power, and
- a first battery contact for each battery located within each of said recesses, each of said first battery contacts extending to the exterior of said housing for contacting one or more connector pins on said leadframe; and
- a second battery contact extending in a spaced relationship to each of said recesses for removably securing a battery in each of said recesses, said second battery contact extending to the exterior of said housing and contacting one or more connector pins on said leadframe.

4. Apparatus according to claim 3 wherein said housing is substantially rectangular having first and second recesses formed in a surface thereof.

5. Apparatus according to claim 3 wherein at least one of said first and second battery contacts is connected to a connector pin for connection to an external source of power to permit a battery to be charged.

6. Apparatus according to claim 3 wherein each of said recesses includes a support surface having a notch therein, said first battery contact being formed of resilient material and positioned in said notch with a portion thereof extending above said support surface when undeformed, said second battery contact urging the battery against said support surface to deflect said first battery contact and provide electrical contact between said first and second battery contacts and the terminals of the battery.

7. Apparatus according to claim 6 wherein said second battery contact is formed of resilient material and each of said recesses includes a semicircular lip and an inclined notch, the batteries being inserted into the recess over the lip by deflecting said second battery contact and being removable with an implement guided by said inclined notch to tilt the battery and deflect the second battery contact for moving the battery over the lip for removal.

8. Apparatus according to claim 6 wherein each battery may be inserted or removed individually from its respective recess.

9. Apparatus according to claim 6 furthr comprising diode means connected to said integrated circuit to prevent current flow to said battery when external power is applied to power said integrated circuit and permit current to flow from said battery to said integrated circuit upon removal of the external power.

10. Apparatus comprising:
- an integrated circuit housed in a package,
- a leadframe connected to said integrated circuit having connector pins extending externally of said package;
- a rectangular structure supported by said package, encompassing said integrated circuit and a portion of said leadframe, said structure having first and second recesses in a surface thereof, each recess shaped to receive a battery and including a semicircular lip, a bottom portion and a notch formed in said bottom portion;
- a first battery contact for each battery located in each of said recesses, each of said first battery contacts extending to the exterior of said structure for contacting one or more of said pins, said first battery contacts being formed of a resilient material and positioned in the notch in the bottom portion of each recess with a portion thereof extending above the bottom portion when nondeformed;
- a second battery contact extending in a spaced relationship with each of said recesses for removably securing a battery in each of said recesses, said second battery contact being secured to said structure, and extending to the exterior of said structure for contacting one or more of said pins, said second battery contact being formed of one of resilient material, said second battery contact urging a battery within a recess against the bottom portion of said recess to deflect the first battery contact therein and provide electrical contact between said first and second battery contacts and the terminals of the battery;
- said bottom portion of each of said recesses further including an inclined notch and each of said recesses having a slot formed through the wall thereof opposite the lip, the batteries being insertable into each recess over the lip by deflecting said second battery contact and being removable with an implement guided by said inclined notch by tilting the battery and deflecting the second battery contact when an implement is inserted through the slot to move the battery over the lip for removal.

11. Apparatus according to claim 10 wherein at least one of said first and second battery contacts are in contact with a pin to permit one or more batteries to be charged.

12. A method of constructing an apparatus comprising the steps of mounting an integrated circuit and a leadframe interconnected therewith in an insulating housing such that said leadframe is partially within said housing and extends outwardly from said housing; forming at least one recess in said housing adapted to receive a battery; securing first clip means to said housing extending in a spaced relationship to said recess for securing a battery in the recess; and electrically interconnecting said integrated circuit and said battery by electrical conduction means; mounting external electrical conduction means to said housing extending from said battery and said integrated circuit for connection to a source of external power; and connecting diode means to said integrated circuit to prevent current flow to said battery when external power is applied to power said integrated circuit and permit current to flow from said integrated circuit upon removal of the external power.

13. The method according to claim 12 further comprising the step of securing second clip means to said housing within said recess, said first and second clip means contacting the terminals of the battery for conducting power from the battery to the integrated circuit.

14. The method according to claim 12 further comprising the steps of:
forming a lip at said recess, said first clip means being formed of a flexible material to permit the battery to be positioned in and removed from said recess over the lip.

15. A method of constructing an apparatus for use in conjunction with an integrated circuit comprising the steps of:
electrically connecting terminals on the integrated circuit to connector pins in a leadframe;
encasing said integrated circuit and lead frame in a package, said leadframe having pins extending outside said package;
forming at least one recess in the surface of a structure secured to said package, each of said recesses being adapted for receiving a battery;
securing a first battery contact to said package within each of said recesses, each of said first battery contacts extending to the exterior of said structure for contacting one or more pins in said leadframe;
securing a second battery contact to said structure extending in a spaced relationship to each of said recesses for removably securing a battery in each of said recesses, said second battery contact extending to the exterior of said structure for contacting one or more pins in said leadframe; the first and second battery contacts being formed of a conductive material and contacting the terminals of a battery secured in said recess to power said integrated circuit.

16. The method of claim 15 wherein each recess includes a bottom portion and further comprising the step of forming a notch in said bottom portion, the first battery contact being formed of resilient material and secured to said package within said notch, a portion of said first battery contact extending above the bottom portion when undeformed, said second battery contact urging the battery against said bottom portion to deflect said first battery contact and provide electrical contact between said first and second battery contacts and the terminals of the battery.

17. The method of claim 15 further comprising the step of electrically connecting a diode to said leadframe and integrated circuit to block current flow into a battery from a power source external of said package and permit current to flow from a battery to said integrated circuit.

18. The method of claim 15 further comprising the step of forming a semicircular lip in said structure at each recess, said second battery contact being formed of resilient material, a battery being inserted into a recess over the lip by deflecting said second battery contact.

19. The method of claim 18 wherein each recess includes a bottom portion and further comprising the step of forming an inclined notch in said bottom portion of each recess, and said battery being removable from a recess with a nonconductive implement guided by said inclined notch to tilt the battery and deflect said second battery contact for moving the battery over the lip.

20. The method of claim 19 further comprising the step of forming a slot in said structure into each of said recesses opposite the lip to permit use of an implement through said slot to move the battery over the lip for removal.

* * * * *